(12) United States Patent
Xia et al.

(10) Patent No.: US 12,040,334 B2
(45) Date of Patent: *Jul. 16, 2024

(54) METHOD FOR MANUFACTURING SOURCE-DRAIN ELECTRODE, METHOD FOR MANUFACTURING ARRAY SUBSTRATE, AND DISPLAY MECHANISM

(71) Applicants: Beihai HKC Optoelectronics Technology Co., Ltd., Beihai (CN); HKC Corporation Limited, Shenzhen (CN)

(72) Inventors: Yuming Xia, Shenzhen (CN); En-Tsung Cho, Shenzhen (CN); Haijiang Yuan, Shenzhen (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 244 days.

This patent is subject to a terminal disclaimer.

(21) Appl. No.: 17/370,399

(22) Filed: Jul. 8, 2021

(65) Prior Publication Data

US 2022/0028902 A1 Jan. 27, 2022

(30) Foreign Application Priority Data

Jul. 27, 2020 (CN) .......................... 202010732030.7

(51) Int. Cl.
*H01L 21/288* (2006.01)
*H01L 27/12* (2006.01)
*H01L 29/417* (2006.01)

(52) U.S. Cl.
CPC ........ *H01L 27/127* (2013.01); *H01L 21/2885* (2013.01); *H01L 27/1292* (2013.01); *H01L 29/41733* (2013.01)

(58) Field of Classification Search
CPC ............ H10K 59/124; H10K 59/1216; H10K 59/131; H10K 77/111; H10K 59/1201;
(Continued)

(56) References Cited

U.S. PATENT DOCUMENTS

| 6,183,880 B1 | 2/2001 | Yoshioka et al. |
| 2003/0089942 A1 | 5/2003 | Bhattacharyya |

(Continued)

FOREIGN PATENT DOCUMENTS

| CN | 101553933 A | 10/2009 |
| CN | 102263060 A | 11/2011 |

(Continued)

*Primary Examiner* — Samuel A Gebremariam
(74) *Attorney, Agent, or Firm* — Franklin & Associates International Inc; Matthew Lambrinos

(57) ABSTRACT

The present disclosure relates to a source-drain electrode and a method for manufacturing the same, an array substrate and a method for manufacturing the same, and a display mechanism. A method for manufacturing a source-drain electrode includes steps of: disposing a conductive layer on an underlay; forming a photoresist layer on a side of the conductive layer away from the underlay; exposing and then developing the photoresist layer to form grooves passing through the photoresist layer on the photoresist layer, so as to form a patterned photoresist layer; and electrochemically depositing a functional material on the patterned photoresist layer and then removing the photoresist layer to obtain the conductive layer on which a patterned layer is formed, so as to obtain the source-drain electrode. The source-drain electrode manufactured by the above method has a higher conductivity.

15 Claims, 5 Drawing Sheets

(58) Field of Classification Search
CPC .......... H10K 2102/311; H01L 27/1218; H01L 27/124; H01L 27/1248
See application file for complete search history.

(56) References Cited

U.S. PATENT DOCUMENTS

| | | |
|---|---|---|
| 2003/0134142 A1 | 7/2003 | Ivey et al. |
| 2004/0031691 A1 | 2/2004 | Kelly et al. |
| 2004/0118694 A1 | 6/2004 | Yang et al. |
| 2006/0175202 A1 | 8/2006 | Mazur |
| 2007/0128857 A1 | 6/2007 | Jenq et al. |
| 2008/0092947 A1 | 4/2008 | Lopatin et al. |
| 2008/0217182 A1 | 9/2008 | Dai |
| 2013/0075262 A1 | 3/2013 | Teng |
| 2015/0147586 A1 | 5/2015 | De Strycker et al. |
| 2015/0378223 A1* | 12/2015 | Wen .................... H01L 27/0288 349/40 |
| 2019/0196285 A1* | 6/2019 | Zhou .................... H01L 21/2885 |
| 2020/0043841 A1 | 2/2020 | Arai et al. |
| 2022/0028905 A1* | 1/2022 | Xia .................... H01L 29/42384 |

FOREIGN PATENT DOCUMENTS

| | | | |
|---|---|---|---|
| CN | 104617042 | * 2/2015 | ......... H01L 21/2885 |
| CN | 104617042 A | 5/2015 | |
| CN | 104638016 A | 5/2015 | |
| CN | 108172584 A | 6/2018 | |
| CN | 109338425 A | 2/2019 | |
| CN | 110690171 A | 1/2020 | |
| JP | H0918119 A | 1/1997 | |
| WO | 2015065150 A1 | 5/2015 | |
| WO | 2017014605 A1 | 1/2017 | |

\* cited by examiner

METHOD FOR MANUFACTURING SOURCE-DRAIN ELECTRODE, METHOD FOR MANUFACTURING ARRAY SUBSTRATE, AND DISPLAY MECHANISM

CROSS REFERENCES TO RELATED APPLICATIONS

This patent application claims the benefit of Chinese Patent Application No. 202010732030.7, entitled "METHOD FOR MANUFACTURING SOURCE-DRAIN ELECTRODE, METHOD FOR MANUFACTURING ARRAY SUBSTRATE, AND DISPLAY MECHANISM", filed on Jul. 27, 2020, the entire content of which is incorporated herein in its entirety.

TECHNICAL FIELD

The present disclosure relates to a method for manufacturing a source-drain electrode, a method for manufacturing an array substrate, and a display mechanism.

BACKGROUND

TFT is short for Thin Film Transistor. A TFT display screen is a type of active matrix liquid crystal display device. Each liquid crystal pixel point on the TFT display screen is driven by a thin film transistor integrated behind the pixel point. The TFT display screen has advantages of high response, high brightness, high contrast, and the like, which is a mainstream display device. An array substrate includes a plurality of components such as gate and source-drain electrode. The conductivity of the source-drain electrode directly affects the performance of the array substrate. Generally, a method for manufacturing the source-drain electrode mainly includes the following steps: forming a metal layer on an underlay and etching the metal layer to form a pattern to obtain the source-drain electrode.

SUMMARY

According to various embodiments of the present disclosure, what is provided is:

A method for manufacturing a source-drain electrode, which includes steps of:
  disposing a conductive layer on an underlay;
  forming a photoresist layer on a side of the conductive layer away from the underlay;
  exposing and then developing the photoresist layer to form grooves passing through the photoresist layer on the photoresist layer, so as to form a patterned photoresist layer; and
  electrochemically depositing a functional material on the patterned photoresist layer and then removing the photoresist layer to obtain the conductive layer on which a patterned layer is formed, so as to obtain the source-drain electrode.

A method for manufacturing an array substrate, which includes steps of:
  disposing a gate layer on an underlay;
  disposing an insulating layer on a side of the gate layer away from the underlay;
  disposing an active layer and a data line on a side of the insulating layer away from the underlay;
  disposing a first conductive layer on the active layer;
  forming a first photoresist layer on a side of the first conductive layer away from the underlay;
  exposing and then developing the first photoresist layer to form grooves passing through the first photoresist layer on the first photoresist layer, so as to form a patterned first photoresist layer; and
  electrochemically depositing a first functional material on the patterned first photoresist layer and then removing the first photoresist layer to obtain the first conductive layer on which a first patterned layer is formed, so as to form a source-drain electrode, thereby obtaining an array substrate.

A display mechanism, which includes a source-drain electrode manufactured by the method for manufacturing the source-drain electrode as described above or an array substrate manufactured by the method for manufacturing the array substrate as described above.

The details of one or more implementations of the subject matter described in this specification are set forth in the accompanying drawings and the description below. Other potential features, aspects, and advantages of the subject matter will become apparent from the description, the drawings, and the claims

BRIEF DESCRIPTION OF THE DRAWINGS

The following drawings of the present disclosure are used herein as part of the present disclosure to understand the present disclosure. Embodiments of the present disclosure and description thereof are illustrated in the accompanying drawings to explain the principle of the present disclosure.

DETAILED DESCRIPTION OF THE EMBODIMENTS

The conductivity of the source-drain electrode obtained in the way described in the Background is relatively low, which affects the performance of the array substrate.

In order to facilitate the understanding of the present disclosure, the present disclosure will be described more fully with reference to the relevant drawings. Preferred embodiments of the present disclosure are shown in the attached drawings. However, the present disclosure can be implemented in many different forms and is not limited to the embodiments described herein. On the contrary, providing these embodiments is to make an understanding on the disclosure of the present disclosure more thorough and comprehensive.

Unless otherwise defined, all technical and scientific terms used herein have the same meaning as commonly understood by those skilled in the technical field of the present disclosure. The terms used in this specification of the present disclosure herein are only for the purpose of describing specific embodiments, and are not intended to limit the present disclosure.

Figure 1:
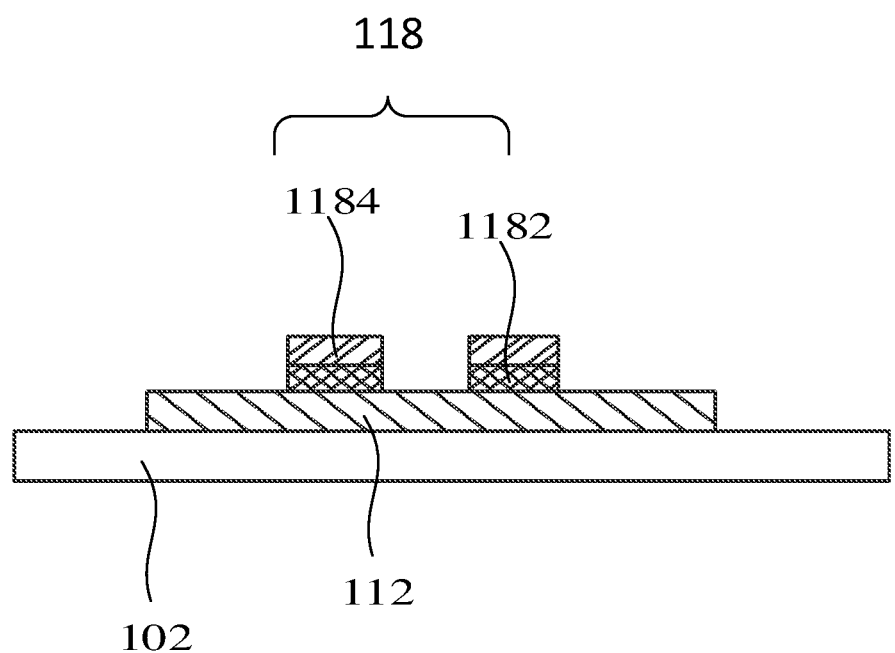
FIG. 1 is a structural schematic view of a source-drain electrode according to an embodiment.

As shown in FIG. 1, a method for manufacturing a source-drain electrode according to an embodiment is provided. The source-drain electrode with a higher conductivity can be obtained by using this method, such that the charging and discharging time of the array substrate is shortened. Specifically, the method includes S110~S140.

Figure 2:
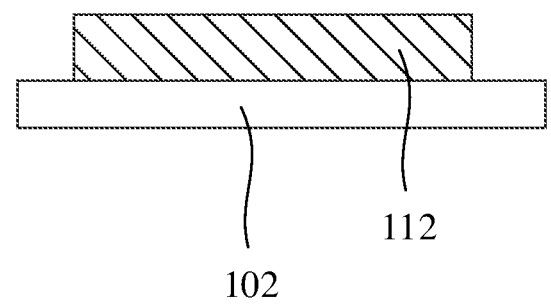
FIG. 2 is a schematic view showing a structure after forming a conductive layer on an underlay in a method for manufacturing the source-drain electrode shown in FIG. 1.

Referring to FIG. 2, S110, a conductive layer 112 is disposed on an underlay 102.

By disposing the conductive layer 112 on the underlay 102 as described above, an adhesion between the source-drain electrode and the underlay 102 can be increased.

In one of the embodiments, the underlay 102 is a glass substrate, a plastic substrate, or a flexible substrate.

In one of the embodiments, a thickness of the underlay 102 is in a range of 0.2 mm to 1 mm.

In one of the embodiments, the conductive layer 112 is a metal conductive layer. Further, the conductive layer 112 is a molybdenum layer or a titanium layer.

In one of the embodiments, in the step of disposing the conductive layer 112 on the underlay 102, the conductive layer 112 is disposed on the underlay 102 by deposition. Further, a method for the deposition is vapor deposition or electrochemical deposition. Furthermore, the method for the deposition is vacuum evaporation, sputtering deposition, arc plasma plating or ion plating. It should be noted that the method of disposing the conductive layer 112 on the underlay 102 is not limited to the above method, and other methods such as electroless plating or atomic layer deposition may also be used.

In one of the embodiments, a thickness of the conductive layer 112 is in a range of 300 A to 800 A.

Figure 3:
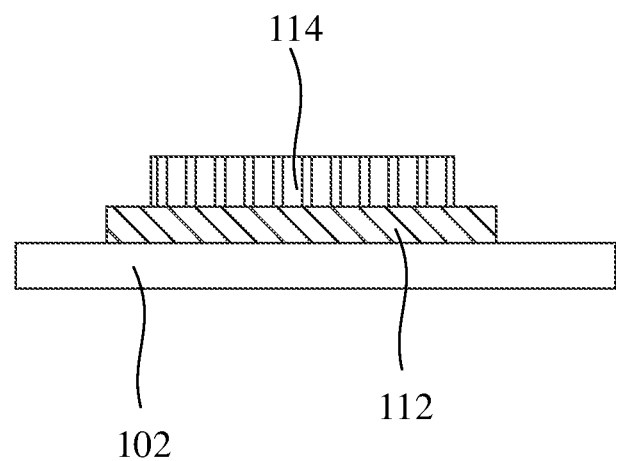
FIG. 3 is a schematic view showing a structure after disposing a photoresist layer on a side of the conductive layer away from the underlay in the method for manufacturing the source-drain electrode shown in FIG. 2.

Referring to FIG. 3, S120, a photoresist layer 114 is formed on a side of the conductive layer 112 away from the underlay 102.

Specifically, a photoresist is applied on the side of the conductive layer 112 away from the underlay 102 to obtain the photoresist layer 114.

In one of the embodiments, a thickness of the photoresist layer 114 is in a range of 1.5 μm to 2.5 μm.

Figure 4:
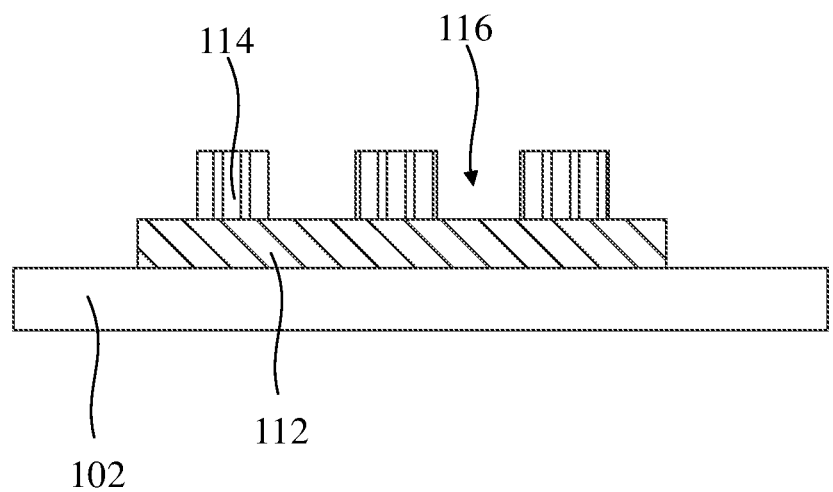
FIG. 4 is a schematic view showing a structure after exposing and then developing a side of the photoresist layer away from the conductive layer to form grooves passing through the photoresist layer in the method for manufacturing the source-drain electrode shown in FIG. 3.

Referring to FIG. 4, S130, a side of the photoresist layer 114 away from the conductive layer 112 is exposed, and then developed to form grooves 116 passing through the photoresist layer 114 on the photoresist layer 114, so as to form a patterned photoresist layer 114.

Specifically, a mask is used to expose and then develop the side of the photoresist layer 114 away from the conductive layer 112, such that the photoresist layer 114 is provided with the grooves 116 passing through the photoresist layer 114.

Figure 5:
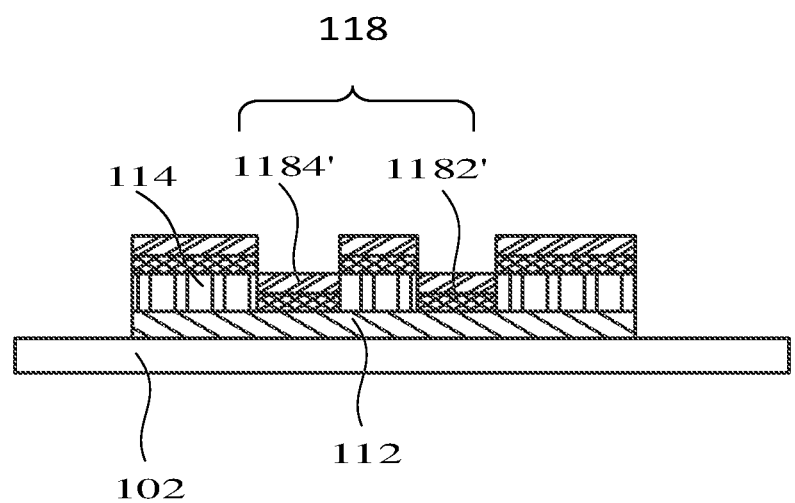
FIG. 5 is a schematic view showing a structure after electrochemically depositing a metal layer and a barrier layer on a patterned photoresist layer in the method for manufacturing the source-drain electrode shown in FIG. 4.

Refer to FIG. 5, S140, a functional material is electrochemically deposited on the patterned photoresist layer 114, and then the photoresist layer 114 is removed to obtain the conductive layer 112 on which a patterned layer 118 is formed, so as to obtain the source-drain electrode 110.

Generally, a metal is etched to obtain the conductive layer 112 on which the patterned layer 118 was formed on the metal. The conductivity of the patterned layer 118 obtained in this way is relatively low, which affects the performance of the array substrate containing the source-drain electrode 110. The electrochemical deposition refers to a technology in which under the action of an external electric field, positive and negative ions migrate in an electrolyte and a redox reaction of gain and loss of electrons occurs on electrodes so as to form a plating layer. The patterned layer 118 manufactured by the electrochemical deposition method has good density and high conductivity, which is beneficial to shorten the charging time of the array substrate containing the source-drain electrode 110 and ensures the performance of the array substrate containing the source-drain electrode 110.

In one of the embodiments, a temperature of electrochemical deposition is in a range of 10° C. to 35° C. By performing electrochemical deposition at room temperature, it is possible to avoid a decrease in conductivity caused by poor flatness due to the provision of coarse particles, and to improve the conductivity of the patterned layer 118.

In one of the embodiments, the step of electrochemically depositing the functional material on the patterned photoresist layer 114 and then removing the photoresist layer 114 to obtain the conductive layer 112 on which the patterned layer 118 is formed includes: sequentially electrochemically depositing a metal material and a barrier material on the photoresist layer 114, and then removing the photoresist layer 114 to form a metal layer 1182 and a barrier layer 1184 that are stacked, so as to obtain the patterned layer 118. By disposing the barrier layer 1184 on the metal layer 1182, the metal layer 1182 can be prevented from being oxidized or contaminated, so as to improve the adhesion between the metal layer 1182 and other components.

In one of the embodiments, the metal material is copper. It should be noted that the metal material is not limited to copper, and the metal material may also be other metal materials, such as aluminum. Further, the barrier material is molybdenum or titanium.

In one of the embodiments, a thickness of the metal layer 1182 is in a range of 2000 A to 4000 A. A thickness of the barrier layer 1184 is in a range of 300 A to 800 A.

In one of the embodiments, the metal layer 1182 is a copper layer. The metal layer 1182 is a copper layer, it is possible to improve the conductivity of the source-drain electrode 110, reduce the RC time (i.e., charging and discharging time), increase the refresh rate of the array substrate containing the source-drain electrode 110, and reduce the charging time of the array substrate. Generally, hydrogen peroxide is used to etch the copper layer to obtain the conductive layer 112 on which the patterned layer 118 is formed. The etching rate is relatively slow, and the hydrogen peroxide is easily decomposed by high-concentration metal ions, releasing a large amount of heat and thus causing an explosion, which results in that the security risk is high. In this embodiment, through the electrochemical deposition method, the metal layer 1182 can be provided without etching. The deposition rate is fast, the problem of explosion due to the heat released by the decomposition of hydrogen peroxide can be avoided, and the safety is higher. Further, the barrier layer 1184 is a molybdenum layer or a titanium layer.

It should be noted that the metal layer 1182 is not limited to the copper layer, and the metal layer 1182 may also be other components, for example, an aluminum layer.

In one of the embodiments, in the step of sequentially electrochemically depositing the metal material and the barrier material on the patterned photoresist layer 114, the metal material and the barrier material are sequentially electrochemically deposited on the patterned photoresist layer 114. The metal material and the barrier material are continuously electrochemically deposited in sequence to shorten the time interval between the disposing of the metal layer 1182 and the disposing of the barrier layer 1184, and further reduce the oxidation of the metal layer 1182, so as to improve the adhesion between the metal layer 1182 and other components.

Figure 6:
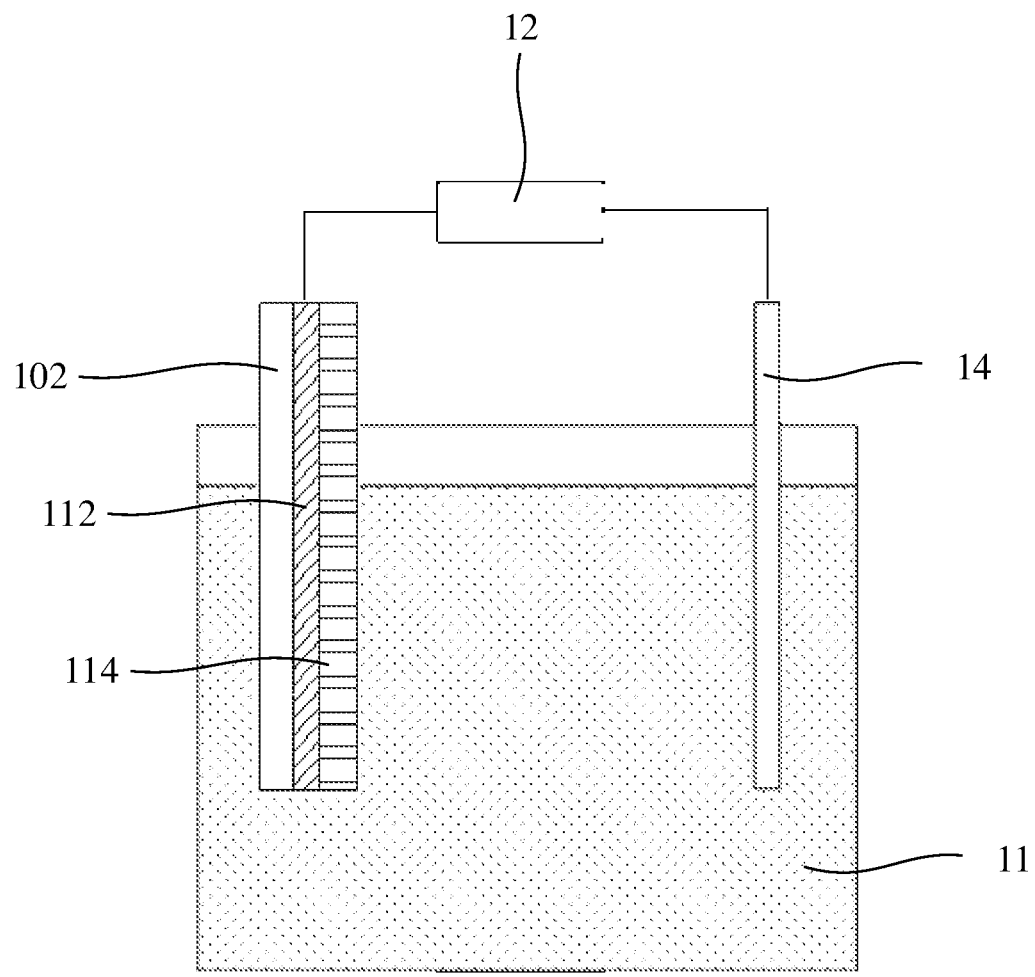
FIG. 6 is a schematic view showing an operation of electrochemically depositing the metal layer and the barrier layer on the patterned photoresist layer in the method for manufacturing the source-drain electrode shown in FIG. 5.

Referring to FIG. 6, in one of the embodiments, the step of sequentially electrochemically depositing the metal material and the barrier material on the patterned photoresist layer 114 includes: placing the patterned photoresist layer 114 in an electrolytic cell 11, electrically connecting the conductive layer 112 and a counter electrode 14 to both ends of a power source 12, respectively, and placing the conductive layer 112 and the counter electrode 14 in an electrolyte for electrochemical deposition. Further, the photoresist layer 114 is disposed opposite to the counter electrode 14.

In one of the embodiments, the step of sequentially electrochemically depositing the metal material and the barrier material on the patterned photoresist layer 114 includes: placing the patterned photoresist layer 114 in an electrolyte containing a first ion and a second ion, energizing the electrolyte under a condition of a first reduction potential or a first reduction current such that the first ion is reduced and deposited on the patterned photoresist layer 114, so as to form a metal material layer 1182'; and energizing the electrolyte at a second reduction potential or a second reduction current such that the second ion is reduced and deposited on the metal material layer 1182', so as to form a barrier material layer 1184'. By changing the potential, the metal material layer 1182' and the barrier material layer 1184' can be continuously and sequentially deposited to prevent the metal layer 1182 from being oxidized or contaminated. Further, the power source 12 is a pulse power source 12.

In one of the embodiments, the first ion is $Cu^{2+}$. The second ion is $MoO_4^{2-}$ or $Ti^{2+}$. In the electrochemical deposition process, the reaction formula of $Cu^{2+}$ is that: $Cu^{2+}+2e=Cu$; the reaction formula of $MoO_4^{2-}$ is that: $MoO_4^{2-}+8H^++6e-=Mo+4H_2O$. It should be noted that the first ion is not limited to $Cu^{2+}$, and may also be other ion, for example, $Al^{3+}$.

Further, when the first ion is $Cu^{2+}$ and the second ion is $MoO_4^{2-}$, the counter electrode 14 is a Pt (platinum) electrode or a Ti electrode. It should be noted that the corresponding counter electrode 14 can be provided according to different first ions and second ions, so as to reduce the first ions and the second ions.

In one of the embodiments, the first ion is $Cu^{2+}$, and the first reduction potential is 0.3419V.

In one of the embodiments, the first ion is $Cu^{2+}$, and the density of the first reduction current is in a range of 1.5 $A/dm^2$ to 8.0 $A/dm^2$.

In one of the embodiments, the second ion is $MoO_4^{2-}$, and the second reduction potential is in a range of −0.0036V.

In one of the embodiments, the second ion is $MoO_4^{2-}$, and the second reduction potential is in a range of 0.5 $A/dm^2$ to 1.2 $A/dm^2$.

In one of the embodiments, the second ion is $Ti^{2+}$, and the second reduction potential is in a range of −1.2V to −1.7V.

In one of the embodiments, the second ion is $Ti^{2+}$, and the density of the second reduction current is in a range of 5 $A/dm^2$ to 50 $A/dm^2$.

In one of the embodiments, the first ion is $Cu^{2+}$, the second ion is $MoO_4^{2-}$, the second reduction potential is −0.0036V, and the first reduction potential is 0.3419V. Such a setting can ensure that the second ion will not be reduced at the same time when the first ion is reduced, and can ensure that the metal layer 1182 that has been provided will not be affected when the second ion is reduced.

In one of the embodiments, the electrolyte contains the first ion of 1.5 mol/L to 4.0 mol/L and the second ion of 0.25 mol/L to 0.5 mol/L. Such a setting can ensure the deposition of the metal layer 1182 and the barrier layer 1184, and ensure the performance of the patterned layer 118.

In one of the embodiments, the first ion is $Cu^{2+}$, and the electrolyte contains the first ion of 1.5 mol/L to 4.0 mol/L. During manufacturing the electrolyte, $Cu^{2+}$ is added in a form of a soluble copper salt. Further, the soluble copper salt is at least one selected from a group consisted of copper sulfate, copper nitrate and copper chloride. It should be noted that the soluble copper salt is not limited to the copper salt as mentioned above, and may also be other soluble copper salts commonly used in an electroplating process.

In one of the embodiments, the second ion is $MoO_4^{2-}$, and the electrolyte contains the second ion of 0.25 mol/L to 0.5 mol/L. During manufacturing the electrolyte, $MoO_4^{2-}$ is added in a form of soluble molybdate. Further, the soluble molybdate is at least one selected from a group consisted of sodium molybdate and potassium molybdate. It should be noted that the soluble molybdate is not limited to the soluble molybdate as mentioned above, and may also be other soluble molybdates commonly used in an electroplating process. Furthermore, the second ion is $MoO_4^{2-}$, and the electrolyte contains $Cu^{2+}$ of 1.5 mol/L to 4.0 mol/L and $MoO_4^{2-}$ of 0.25 mol/L to 0.5 mol/L.

In one of the embodiments, the second ion is $Ti^{2+}$, and the electrolyte contains the second ion of 0.25 mol/L to 0.5 mol/L. During manufacturing the electrolyte, $Ti^{2+}$ is added in a form of soluble titanium salt. Further, the soluble titanium salt is at least one of selected from a group consisted of titanium chloride and titanium sulfate.

Furthermore, the electrolyte further contains an acid of 30 g/L to 100 g/L. Further, the acid is at least one selected from a group consisted of $H_2SO_4$, HCl, and $H_3PO_4$. It should be noted that the acid is not limited to the acid as mentioned above, and may also be other acids commonly used in an electroplating process.

The electrolyte further contains a brightener of 0.3 mL/L to 1 mL/L. The brightener is used to remove oil stains and impurities remaining on a metal surface and maintain external cleanliness, glossiness and color fastness of the metal surface. Further, the brightener is at least one selected from a group consisted of sodium lauryl sulfate, polyethyleneglycol and sodium allylsulfonate. The polyethyleneglycol (PEG) is PEG400, PEG1000 or PEG4000. It should be noted that the brightener is not limited to the brightener as mentioned above, and may also be other brighteners commonly used in an electroplating process.

The electrolyte further contains a soluble chloride salt. Further, the soluble chlorine salt is at least one selected from a group consisted of sodium chloride, potassium chloride and magnesium chloride. In the electrolyte, a concentration of chloride ion of the soluble chloride salts is in a range of 30 mg/L to 120 mg/L. It should be noted that the soluble chloride salt is not limited to the chloride salt as mentioned above, and may also be other soluble chloride salts commonly used in an electroplating process.

The electrolyte further contains a leveling agent of 0.1 mL/L to 0.8 mL/L. By adding the leveling agents, the flatness of the plating layer can be improved, such that a surface of the plating layer can be smoother. The leveling agent is at least one selected from a group consisted of polystyrene, polyacrylic acid and polyvinyl alcohol. It should be noted that the leveling agent is not limited to the leveling agent as mentioned above, and can also be other leveling agents commonly used in an electroplating process.

The electrolyte further contains an additive of 0.1 mL/L to 1.5 mL/L. The additive is at least one selected from a group consisted of a lubricant and a plating cylinder. The plating cylinder can remove burrs of the plating layer. It should be noted that the additive is not limited to the additive as mentioned above, and may also be other additives commonly used in an electroplating process.

In one of the embodiments, the electrolyte contains $Cu^{2+}$ of 1.5 mol/L to 4.0 mol/L, $MoO_4^{2-}$ of 0.25 mol/L to 0.5 mol/L, a soluble chloride salt (a final concentration of the chloride ion is in a range of 30 mg/L to 120 mg/L), an acid of 30 g/L to 100 g/L, a brightener of 0.3 mL/L to 1 mL/L, a leveling agent of 0.1 mL/L to 0.8 mL/L and an additive of 0.1 mL/L to 1.5 mL/L. The electrolyte with such setting can obtain the metal layer 1182 and the barrier layer 1184 that are smooth and flat, so as to ensure the conductivity of the gate 126.

In one of the embodiments, a method of removing the photoresist layer 114 is to strip off the photoresist layer 114. Further, the photoresist layer 114 is removed by an ashing process. It should be noted that while removing the photoresist layer 114, the metal material layer 1182' and the barrier material layer 1184' deposited on the photoresist layer 114 are removed together, so as to form the metal layer 1182 and the barrier layer 1184 that are stacked.

In the above methods for manufacturing the source-drain electrode 110, the conductive layer 112 is disposed on the underlay 102. The photoresist layer 114 is formed on the side of the conductive layer 112 away from the underlay 102. The photoresist layer 114 is exposed and then developed to form the grooves 116 passing through the photoresist layer on the photoresist layer 114, so as to form the patterned photoresist layer 114. The functional material is electrochemically deposited on the patterned photoresist layer 114. Then, the photoresist layer 114 is removed to obtain the conductive layer 112 on which the patterned layer 118 is formed, so as to obtain the source-drain electrode 110. The patterned layer 118 obtained by electrochemical deposition can have a better density, which is beneficial to improve the conductivity of the source-drain electrode 110, so as to improve the performance of the array substrate. It is verified by experiments that the conductivity of the source-drain electrode 110 is in a range of $3.0*10^6$ S/m to $8.0*10^6$ S/m.

In the above methods for manufacturing the source-drain electrode 110, the metal layer 1182 is disposed between the conductive layer 112 and the barrier layer 1184 by the electrochemical deposition process, which can avoid a poor surface flatness of the patterned layer 118 caused by the formation of coarse particles, and thus avoid the problem that the conductivity of the metal layer 1182 decreases due to the poor flatness of the patterned layer 118. Moreover, using the copper as the metal layer 1182 can improve the conductivity of the metal layer 1182, reduce the RC time, increase the refresh rate of the array substrate containing the source-drain electrode 110, and reduce the charging time of the array substrate with the source-drain electrode 110.

In the above methods for manufacturing the source-drain electrode 110, by setting the electrolyte containing the first ion and the second ion, and by controlling a pulse voltage, the metal layer 1182 and the barrier layer 1184 can be deposited continuously, which can effectively prevent the metal layer 1182 from being oxidized or contaminated and thus prevent affecting the conductivity of the source-drain electrode 110.

It can be understood that the step of sequentially electrochemically depositing the metal material and the barrier material on the patterned photoresist layer 114 is not limited to the methods as mentioned above, and may also be other methods. For example, in other embodiments, the step of sequentially electrochemically depositing the metal material and the barrier material on the patterned photoresist layer 114 includes: placing the patterned photoresist layer 114 in a first electrolyte containing the first ion for electrochemical deposition such that the first ion is reduced and thus the metal material is deposited in the grooves 116 to form the metal material layer 1182'; placing and the photoresist layer 114 on which the metal material layer 1182' is formed in a second electrolyte containing the second ion for electrochemical deposition such that the second ion is reduced and deposited on the metal material layer 1182' to form the barrier material layer 1184'.

The first electrolyte is substantially the same as the electrolyte of the above embodiments, except that the first electrolyte does not contain the second ion. The second electrolyte contains the second ion with an initial concentration of 0.25 mol/L to 0.5 mol/L.

Further, the second electrolyte further contains an acid of 20 g/L to 70 g/L. Further, the acid is at least one selected from a group consisted of $H_2SO_4$, HCl, and $H_3PO_4$. It should be noted that the acid is not limited to the acids as mentioned above, and may also be other acids commonly used in an electroplating process.

The second electrolyte further contains a brightener of 0.2 mL/L to 0.8 mL/L. Further, the brightener is at least one selected from a group consisted of sodium lauryl sulfate, polyethyleneglycol and sodium allylsulfonate. The polyethyleneglycol (PEG) is PEG400, PEG1000 or PEG4000. It should be noted that the brightener is not limited to the brightener as mentioned above, and may also be other brighteners commonly used in an electroplating process.

The second electrolyte further contains a leveling agent of 0.1 mL/L to 0.6 mL/L. The leveling agent is at least one selected from a group consisted of polystyrene, polyacrylic acid and polyvinyl alcohol. It should be noted that the leveling agent is not limited to the leveling agent as mentioned above, and can also be other leveling agents commonly used in an electroplating process.

The second electrolyte further contains an additive of 0.1 mL/L to 1.5 mL/L. The additive is at least one selected from a group consisted of a lubricant and a plating cylinder. It should be noted that the additive is not limited to the additive as mentioned above, and may also be other additives commonly used in an electroplating process.

Furthermore, the second electrolyte contains the $MoO_4^{2-}$ of 0.25 mol/L to 0.5 mol/L, the acid of 20 g/L to 70 g/L, the brightener of 0.2 mL/L to 0.8 mL/L, the leveling agent of 0.1 mL/L to 0.6 mL/L, and the additive of 0.1 mL/L to 1.5 mL/L, as an initial concentration. The metal layer and barrier layer that are smooth and flat can be obtained through the electrolyte with such setting, so as to ensure the conductivity of the gate.

In one of the embodiments, prior to the step of placing the photoresist layer 114 on which the metal material layer 1182' is formed in the second electrolyte for electrochemical deposition, the method further includes a step of manufacturing the second electrolyte, which includes adding the second ion into the first electrolyte to obtain the second electrolyte. By adding the second ion into the first electrolyte to obtain the second electrolyte, it is possible to shorten the time interval between the deposition of the metal material layer 1182' and the deposition of the barrier material layer 1184', such that the metal material layer 1182' and the barrier material layer 1184' are continuously deposited, thereby preventing the metal layer 1182 from being oxidized or contaminated.

Further, the step of sequentially electrochemically depositing the metal material and the barrier material on the patterned photoresist layer 114 includes: placing the patterned photoresist layer 114 in the first electrolyte for electrochemical deposition such that the first ion is reduced and deposited on the patterned photoresist layer 114 to form the metal material layer 1182'. When the first ion in the first electrolyte is lower than 10 g/L, the second ion is added into the first electrolyte to obtain the second electrolyte and the electrochemical deposition is performed, such that the second ion is reduced and deposited on the metal material layer 1182' to form the barrier material layer 1184'. Such a setting can not only continuously deposit the metal material layer 1182' and the barrier material layer 1184', but can also avoid the mutual influence between the first ion and the second ion, thereby affecting the deposition of the metal material layer 1182' and the deposition of the barrier material layer 1184'.

In one of the embodiments, an initial concentration of the first ion in the first electrolyte is in a range of 1.5 mol/L to 4.0 mol/L, and an initial concentration of the second ion in the second electrolyte is in a range of 0.25 mol/L to 0.5 mol/L.

In one of the embodiments, the second ion is $MoO_4^{2-}$. An initial concentration of the first ion in the first electrolyte is in a range of 1.5 mol/L to 4.0 mol/L. The second ion is added into the first electrolyte such that an initial concentration of the second ion is in a range of 0.25 mol/L to 0.5 mol/L.

In one of the embodiments, the second ion is $Ti^{2+}$. An initial concentration of the first ion in the electrolyte is in a range of 1.5 mol/L to 4.0 mol/L. The second ion is added into the electrolyte such that an initial concentration of the second ion is in a range of 0.25 mol/L to 0.5 mol/L.

In one of the embodiments, in the step of placing the patterned photoresist layer 114 in the first electrolyte for electrochemical deposition such that the first ion is reduced and deposited on the patterned photoresist layer 114 to form the metal material layer 1182', the first electrolyte is energized under a condition of a first reduction potential or a first reduction current such that the first ion is reduced and deposited on the patterned photoresist layer 114 to form the metal material layer 1182'. Further, the first reduction potential is in a range of 0.34V to 0.8V, and the density of the first reduction current is in a range of 1.5 A/dm² to 8 A/dm².

In one of the embodiments, in the step of placing the photoresist layer 114 on which the metal material layer 1182' is formed in the second electrolyte for electrochemical deposition such that the second ion is reduced and deposited on the metal material layer 1182' to form the barrier material layer 1184', the second electrolyte is energized at the second reduction potential or the second reduction current such that the second ion is reduced and deposited on the metal material layer 1182' to form the barrier material layer 1184'.

Further, the second ion is $MoO_4^{2-}$. The second reduction potential is in a range of −0.3V to 0.1V. The density of the second reduction current is 0.5 A/dm² to 1.2 A/dm². The second ion is $Ti^{2+}$. The second reduction potential is in a range of −1.2V to −1.7V. The second reduction current density is in a range of 5 A/dm² to 50 A/dm².

In the above embodiments, the first electrolyte containing the first ion and the second electrolyte containing the second ion are provided to electrochemically deposit the metal material layer 1182' and the barrier material layer 1184', respectively. When the photoresist layer 114 is removed, the metal layer 1182 and the barrier layer 1184 that are stacked are formed, and the patterned layer 118 with better density can also be obtained, such that the conductivity of the obtained source-drain electrode 110 can be improved. The obtained source-drain electrode 110 can be used to manufacture an array substrate with a shorter charging time.

Further, by using the first electrolyte containing the first ion to electrochemically deposit the metal layer 1182, when the first ion is consumed to have a lower concentration, the second ion are added into the first electrolyte to obtain the second electrolyte, so as to electrochemical deposit the barrier layer 1184. In this way, the metal layer 1182 and the barrier layer 1184 are continuously deposited by controlling the concentrations of the first ion and the second ion, which can effectively prevent the metal layer 1182 from being oxidized or contaminated and prevent affecting the conductivity of the source-drain electrode 110.

It can be understood that the first electrolyte is not limited to the first electrolyte as mentioned above. The first electrolyte may also be the same as the electrolyte of the first embodiment. At this time, the first reduction potential or the first reduction current needs to be adjusted to reduce the first ion in the first electrolyte without reducing the second ion at the same time.

It should be noted that in other embodiments, the step of disposing the conductive layer 112 on the underlay 102 includes: disposing a gate layer on the underlay 102, disposing an insulating layer on a side of the gate layer away from the underlay 102, disposing an active layer on a side of the insulating layer away from the underlay 102, and disposing a conductive layer 112 on the active layer. It should be noted that the gate layer can be disposed on the underlay 102 by a conventional yellow light process, or by the method for manufacturing the source-drain electrode 110 in the first embodiment or the method for manufacturing the source-drain electrode in the second embodiment, which will not be repeated here.

Figure 7:
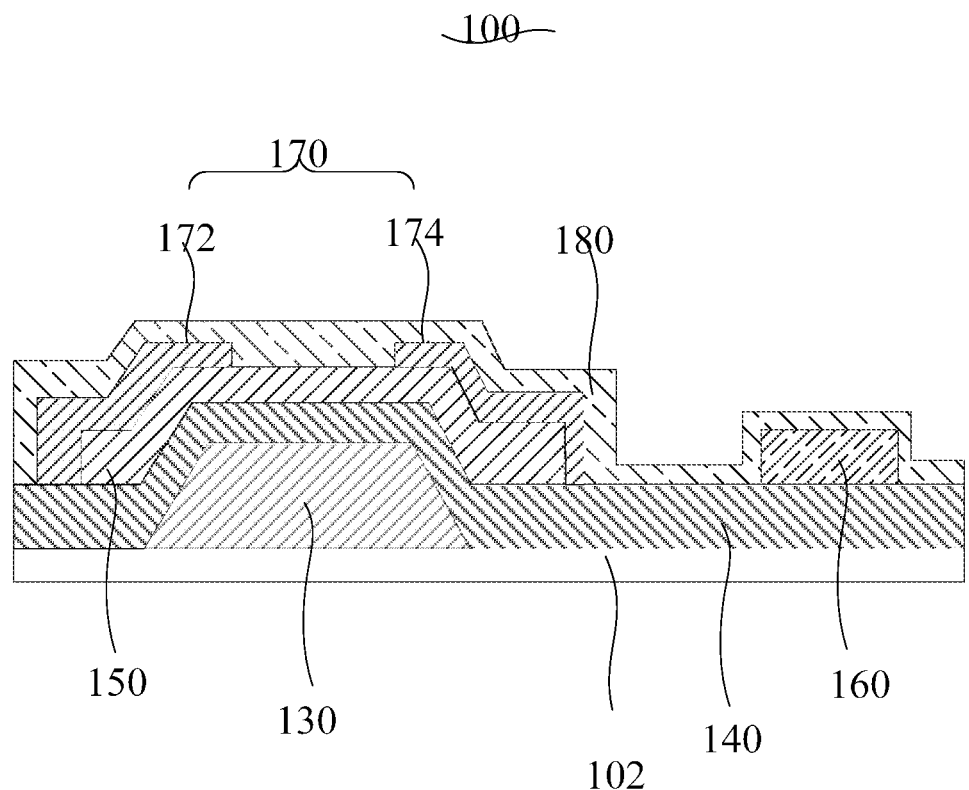
FIG. 7 is a structural schematic view of an array substrate according to an embodiment.

Referring to FIG. 7, additionally, a method for manufacturing the array substrate 100 according to an embodiment is provided, which can manufacture the array substrate 100 with a shorter charging time. The method for manufacturing the array substrate 100 includes the following steps of S210 to S260.

Figure 8:
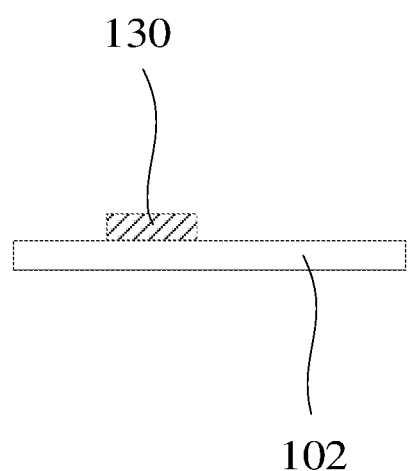
FIG. 8 is a schematic view showing a structure after disposing a gate on an underlay in a method for manufacturing the array substrate shown in FIG. 7.

Referring to FIG. 8, S210, a gate layer 130 is disposed on an underlay 102.

Figure 9:
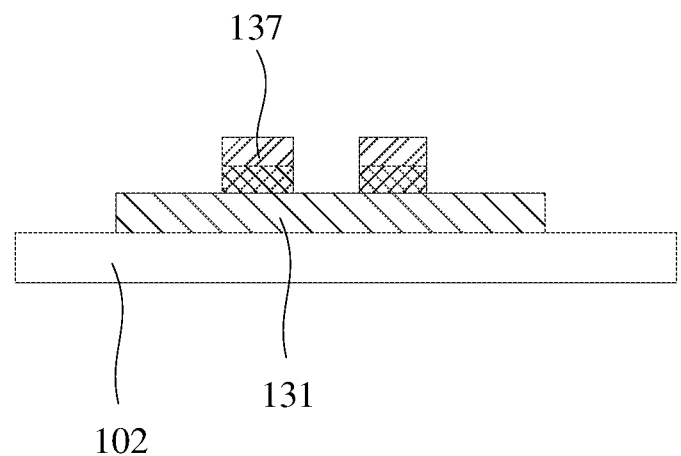
FIG. 9 is a schematic view showing the structure after disposing the gate on the underlay in the method for manufacturing the array substrate shown in FIG. 8 from another perspective.

In one of the embodiments, the gate layer 130 is manufactured by using the method for manufacturing the source-drain electrode 110 in the above embodiments. Referring to FIG. 9, specifically, the step of disposing the gate layer 130 on the underlay 102 includes steps of S211 to S214.

S211, a second conductive layer 131 is disposed on the underlay 102.

By disposing the second conductive layer 131 one the underlay 102, an adhesion between the gate layer 130 and the underlay 102 can be increased.

In one of the embodiments, the underlay 102 is a glass substrate, a plastic substrate or a flexible substrate.

In one of the embodiments, a thickness of the underlay 102 is in a range of 0.2 mm to 1 mm.

In one of the embodiments, the second conductive layer 131 is a metal conductive layer. Further, the second conductive layer 131 is a molybdenum layer or a titanium layer.

In one of the embodiments, in the step of disposing the second conductive layer 131 on the underlay 102, the second conductive layer 131 is disposed on the underlay 102 by deposition. Further, the method for the deposition is vapor deposition or electrochemical deposition. Furthermore, the method for the deposition is vacuum evaporation, sputtering deposition, arc plasma plating or ion plating. It should be noted that the method for disposing the conductive layer 131 on the underlay 102 is not limited to the above method, and other methods such as electroless plating or atomic layer deposition may also be used.

In one of the embodiments, a thickness of the second conductive layer 131 is in a range of 300 A to 800 A.

S212, a second photoresist layer is formed on a side of the second conductive layer 131 away from the underlay 102.

Specifically, a photoresist is applied on the side of the second conductive layer 131 away from the underlay 102 to obtain a second photoresist layer.

In one of the embodiments, a thickness of the second photoresist layer is in a range of 1.5 μm to 2.5 μm.

S213, a side of the second photoresist layer away from the second conductive layer 131 is exposed, and then developed to form grooves passing through the second photoresist layer on the second photoresist layer, so as to form a patterned second photoresist layer.

Specifically, a mask is used to expose and then develop the side of the second photoresist layer away from the second conductive layer 131, such that the second photoresist layer is provided with the grooves passing through the second photoresist layer.

S214. a second functional material is electrochemically deposited on the patterned second photoresist layer, and then the second photoresist layer is removed to obtain the second conductive layer 131 on which a second patterned layer 137 is formed, so as to obtain the gate layer 130.

Generally, a metal is etched to obtain the second patterned layer 137 on the metal. The conductivity of the second patterned layer 137 obtained in this way is relatively low, which affects the performance of the array substrate containing the gate layer 130. The electrochemical deposition refers to a technology in which under the action of an external electric field, positive and negative ions migrate in an electrolyte and a redox reaction of gain and loss of electrons occurs on electrodes so as to form a plating layer. The second patterned layer 137 manufactured by the electrochemical deposition method has good density and high conductivity, which is beneficial to shorten the charging time of the array substrate containing the gate layer 130 and ensures the performance of the array substrate containing the gate layer 130.

In one of the embodiments, an operation of electrochemically depositing a second functional material on the patterned second photoresist layer and then removing the second photoresist layer to obtain the second conductive layer 131 on which the second patterned layer 137 is formed is the same as the operation of electrochemically depositing the functional material on the patterned photoresist layer 114 and then removing the patterned photoresist layer 114 to obtain the conductive layer 112 on which the patterned layer 118 is formed in the above embodiment, and which will not be repeated here.

Through the above manufacturing process, the gate layer 130 with higher conductivity can be obtained. The RC time is reduced. The refresh rate of the array substrate 100 is improved. The charging time of the array substrate 100 is reduced.

In one of the embodiments, the gate layer 130 includes a gate and a gate line. The gate is electrically connected to the gate line.

S220, an insulating layer 140 is disposed on a side of the gate layer 130 away from the underlay 102.

Further, the insulating layer 140 covers a side of the underlay 102 adjacent to the second conductive layer 131 and covers the gate layer 130.

In one of the embodiments, the method of disposing the insulating layer 140 on the side of the gate layer 130 away from the underlay 102 is vapor deposition or electrochemical deposition.

In one of the embodiments, the insulating layer 140 is $SiN_x$, $SiO_2$ or $Al_2O_3$.

In one of the embodiments, a thickness of the insulating layer 140 is in a range of 2000 A to 6000 A.

S230: an active layer 150 and a data line 160 are disposed on a side of the insulating layer 140 away from the underlay 102.

In one of the embodiments, the active layer 150 is disposed opposite to the gate layer 130.

In one of the embodiments, the active layer 150 is disposed on the side of the insulating layer 140 away from the underlay 102 by a deposition process. Further, the method for the deposition is vapor deposition or electrochemical deposition. Furthermore, the method for the deposition is vacuum evaporation, sputtering deposition, arc plasma plating or ion plating.

In one of the embodiments, the active layer 150 is a semiconductor layer. Further, the active layer 150 is an amorphous silicon layer. It should be noted that the active layer 150 is not limited to the amorphous silicon layer, and may also be other semiconductor layers, such as polysilicon, metal oxide.

In one of the embodiments, a thickness of the active layer 150 is in a range of 600 A to 2000 A.

In one of the embodiments, a thickness of the data line 160 is in a range of 2500 A to 6000 A.

In one of the embodiments, the data line 160 is spaced apart from the active layer 150.

In one of the embodiments, the step of disposing the data line 160 on the side of the insulating layer 140 away from the underlay 102 includes steps pf S241 to S244.

S241, a third conductive layer is formed on a side of the insulating layer 140 away from the gate layer 130.

In one of the embodiments, a manufacturing process of the third conductive layer is substantially the same as the manufacturing process of the second conductive layer 131, except that the third conductive layer is formed on the side of the insulating layer 140 away from the gate layer 130.

S242, a third photoresist layer is formed on a side of the third conductive layer away from the insulating layer 140.

In one of the embodiments, a manufacturing process of the third photoresist layer is substantially the same as the manufacturing process of the second photoresist, except that the third photoresist layer is formed on the side of the third conductive layer away from the insulating layer 140.

S243. the third photoresist layer is exposed, and then developed to form grooves passing through the third photoresist layer on the third photoresist layer, so as to form a pattern third photoresist layer.

In one of the embodiments, an operation of S243 is the same as the operation of S143, and which will not be repeated here.

S244: a third functional material is electrochemically deposited on the patterned third photoresist layer, and then the third photoresist layer is removed to obtain the third conductive layer on which a third patterned layer is formed, so as to obtain the data line 160.

In one of the embodiments, an operation of S244 is the same as the operation of S144, and which will not be repeated here.

It should be noted that there is no priority between S230 and S240. S240 can be performed first and then S230 is performed, or S230 can be performed first and then S240 is performed, or S240 and S230 can be operated in parallel.

S250, a source-drain electrode 170 is disposed on a side of the active layer 150 away from the insulating layer 140.

In one of the embodiments, a thickness of the source-drain electrode 170 is in a range of 2500 A to 6000 A.

In one of the embodiments, a part of the source-drain electrode 170 covers a side of the insulating layer 140 away from the underlay 102, and the other part thereof covers a surface of the active layer 150.

Further, the source-drain electrode 170 includes a drain electrode 172 and a source electrode 174. The drain electrode 172 is spaced apart from the source electrode 174. A part of the drain electrode 172 covers the side of the insulating layer 140 away from the underlay 102, and the other part thereof covers the surface of the active layer 150. A part of the source electrode 174 covers the side of the insulating layer 140 away from the underlay 102, and the other part thereof covers the surface of the active layer 150. The source electrode 174 is electrically connected to the data line 160.

In one of the embodiments, the source-drain electrode 170 is disposed on the side of the active layer 150 away from the insulating layer 140 by using the method for manufacturing the source-drain electrode 110 in the above embodiments. Specifically, the step of disposing the source-drain electrode 170 on the side of the active layer 150 away from the insulating layer 140 includes steps of S251 to 254.

S251, a first conductive layer is formed on the side of the active layer 150 away from the insulating layer 140.

In one of the embodiments, a manufacturing process of the first conductive layer is substantially the same as the operation of S110, except that the first conductive layer is formed on the side of the active layer 150 away from the insulating layer 140, and which will not be repeated here.

S252, a first photoresist layer is formed on a side of the first conductive layer away from the insulating layer 140.

In one of the embodiments, a manufacturing process of the first photoresist layer is substantially the same as the operation of S120, except that the first photoresist layer is formed on the side of the first conductive layer away from the insulating layer 140, and which will not be repeated here.

S253. the first photoresist layer is exposed, and then developed to form grooves passing through the first photoresist layer on the first photoresist layer, so as to form a patterned first photoresist layer.

In one of the embodiments, an operation of S253 is the same as the operation of S130, and which will not be repeated here.

S254: a first functional material is electrochemically deposited on the patterned first photoresist layer, and then the first photoresist layer is removed to obtain the first conductive layer on which a first patterned layer is formed, so as to obtain the source-drain electrode 170.

In one of the embodiments, an operation of S254 is the same as the operation of S140, and which will not be repeated here.

Through the above manufacturing process, the source-drain electrode 170 with higher conductivity can be obtained. The RC time is reduced. The refresh rate of the array substrate 100 is improved. The charging time of the array substrate 100 is reduced.

It should be noted that there is no priority between S230 and S250. S230 can be performed first and then S250 is performed, or S250 can be performed first and then S230 is performed, or S230 and S250 can be operated in parallel.

In one of the embodiments, after S230 and prior to S250, the method further includes disposing an ohmic contact layer on a side of the active layer 150 away from the insulating layer 140. The ohmic contact layer is located between the active layer 150 and the source-drain electrode 170. By providing the ohmic contact layer between the source-drain electrode 170 and the active layer 150, it is beneficial to reduce the contact resistance between the drain electrode and the active layer 150, and it is beneficial to reduce the contact resistance between the source electrode and the active layer 150.

Furthermore, the ohmic contact layer covers the surface of the active layer 150. A part of the drain electrode 172 covers the side of the insulating layer 140 away from the underlay 102, and the other part thereof covers the ohmic contact layer. A part of the source electrode 174 covers the side of the insulating layer 140 away from the underlay 102, and the other part thereof covers the ohmic contact layer.

In one of the embodiments, the ohmic contact layer is disposed on the side of the active layer 150 away from the insulating layer 140 by a deposition process. Further, the method for the deposition is vapor deposition or electrochemical deposition. Furthermore, the method for the deposition is vacuum evaporation, sputtering deposition, arc plasma plating or ion plating.

In one of the embodiments, the ohmic contact layer is amorphous silicon doped with a gradient concentration or the same concentration of PH3.

In one of the embodiments, a thickness of the ohmic contact layer is in a range of 200 A to 1000 A.

S260, a protective layer 180 is disposed on a surface of the source-drain electrode 170.

Further, the protective layer 180 covers the surfaces of the insulating layer 140, the source-drain electrode 170 and the active layer 150.

The protective layer 180 is disposed to protect components such as the drain electrode 172, the source electrode 174, and the active layer 150.

In one of the embodiments, the method for disposing the protective layer 180 on the surface of the source-drain electrode 170 is chemical vapor deposition, atomic layer deposition, or the like.

In one of the embodiments, the protective layer 180 is a silicon nitride layer. It should be noted that the protective layer 180 is not limited to the silicon nitride layer, and may also be other protective layers 180, such as silicon oxide, or aluminum oxide.

In one of the embodiments, a thickness of the protective layer 180 is in a range of 1500 A to 5000 A.

In the above method for manufacturing the array substrate 100, the patterned layer 118 of the gate 126, the source-drain electrode 170 or the data line 160 is manufactured in the liquid phase at room temperature by the electrochemical deposition process, which can avoid a poor surface flatness of the patterned layer 118 caused by the formation of coarse particles, and thus avoid the problem that the conductivity of the gate 126, the source-drain electrode 170, or the data line 160 decreases due to the poor flatness of the patterned layer 118. Moreover, using the copper as the metal layer 1182 can improve the conductivity of the gate 126, the source-drain electrode 170, or the data line 160, reduce the RC time, increase the refresh rate of the array substrate 100, and reduce the charging time of the array substrate. The above methods for manufacturing the array substrate 100 can manufacture the array substrate 100 with better performance, which satisfies the requirements of large-scale and batch production.

It can be understood that a method for manufacturing the gate is not limited to the method as mentioned above, and may also be a method commonly used in other display technology fields. For example, in other embodiments, the metal layer and the photoresist layer are sequentially disposed on the underlay. Then, the photoresist layer is exposed and developed by the yellow light process. Then, the metal layer is etched to pattern the metal layer to obtain the gate.

It can be understood that a method for manufacturing the gate line is not limited to the method as mentioned above, and may also be a method commonly used in other display technology fields. For example, in other embodiments, the metal layer and the photoresist layer are sequentially disposed on the underlay. Then, the photoresist layer is exposed and developed by the yellow light process. Then, the metal layer is etched to pattern the metal layer to obtain the gate line.

It can be understood that a method for manufacturing the data line 160 is not limited to the method as mentioned above, and may also be a method commonly used in other display technology fields. For example, in other embodiments, the method for manufacturing the data line is the same as the method for manufacturing the gate layer according to the second embodiment, except that the third conductive layer is formed on the side of the active layer away from the insulating layer. Further, for another example, in other embodiments, the metal layer and the photoresist layer are provided on the side of the insulating layer away from the underlay. Then, the photoresist layer will be exposed and developed by the yellow light process. Then, the metal layer is etched to pattern the metal layer to obtain the data line.

In addition, an array substrate 100 according to an embodiment is further provided, which can be obtained by the method for manufacturing the array substrate according to the above embodiments.

The above array substrates 100 have a short RC time and a short charging time, and can be used to manufacture a display panel with a higher refresh rate and a shorter charging time.

Further, a display mechanism according to an embodiment is further provided, which includes the array substrate 100 according to the above embodiments.

In one of the embodiments, the display mechanism is a liquid crystal display panel, an Organic Light-Emitting Diode (OLED) display panel or a Quantum Dot light Emitting Diode (QLED) display panel. The above display mechanism has a higher refresh rate and a shorter charging time, and can be used to manufacture a display device with excellent performance.

Figure 10:
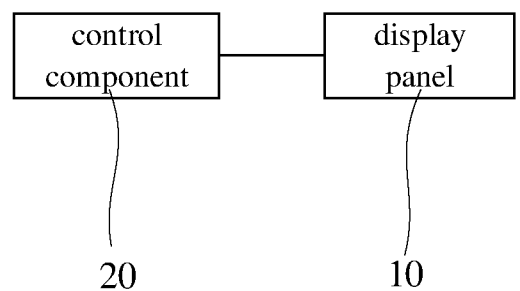
FIG. 10 is a structural schematic view of a display mechanism including the array substrate shown in FIG. 7.

Referring to FIG. 10, the display mechanism includes a display panel 10 and a control component 20.

Figure 11:
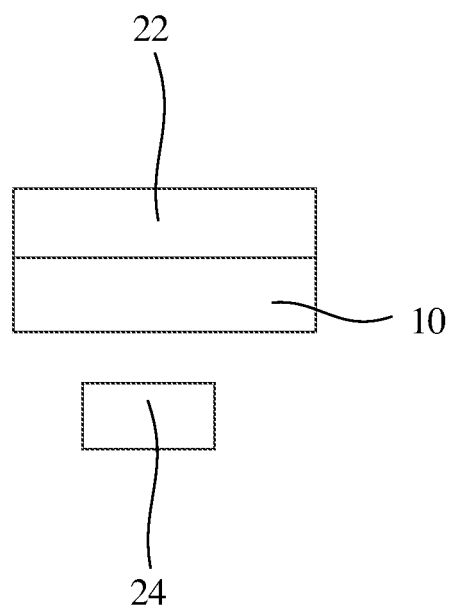
FIG. 11 is a structural schematic view of another embodiment of the display mechanism shown in FIG. 10.

Referring to FIG. 11, in one of the embodiments, the control component 20 includes at least one of a polarizing module 22 and a backlight module 24. The backlight module 24 is used to provide a backlight. The polarizing module 22 is used to polarize light. Further, the control component 20 includes both of the polarizing module 22 and the backlight module 24. The polarizing module 22 and the backlight module 24 are located on both sides of the display panel 10.

In one of the embodiments, the display device is a liquid crystal display device, an OLED display device or a QLED display device.

In one of the embodiments, the display device is a curved display panel. It should be noted that the display device is not limited to the curved display panel, and may also be a flat display panel.

Specific examples are as follows.

Unless otherwise specified, the following examples do not include other components except unavoidable impurities. Unless otherwise specified, drugs and instruments used in the examples are conventional choices in the prior art. The experimental methods that do not specify specific conditions in the examples are implemented according to conventional conditions, such as the conditions described in the prior art or the method recommended by the manufacturer.

Unless otherwise specified, in the following examples, $Cu^{2+}$ is added in a form of copper sulfate, $MoO_4^{2-}$ is added in a form of sodium molybdate, and $Ti^{2+}$ is added in a form of titanium chloride. The chloride ion in an electrolyte mentioned in the following examples is chloride ion in a soluble chloride salt. The underlay is a glass substrate.

Example 1

A manufacturing process of the array substrate of this example was as follows:
(1) A gate layer including a gate and a gate line was formed on an underlay. The step of forming the gate layer on the underlay was as follows:
  (a) A conductive layer was sputtered on the underlay. The conductive layer was a titanium layer and had a thickness of 400 A. The underlay 102 had a thickness of 0.6 mm.
  (b) A metal layer and a barrier layer were sputtered sequentially on a side of the conductive layer away from the underlay. The metal layer was made of copper and had a thickness of 4000 A. The barrier layer was made of titanium, and had a thickness of 300 A.
  (c) A photoresist layer was applied on a side of the barrier layer away from the underlay.
  (d) A side of the photoresist layer away from the barrier layer was exposed using a mask and then developed to form grooves passing through the photoresist layer on the photoresist layer, so as to form a patterned photoresist layer. The metal layer and the barrier layer were etched by an etching process until the conductive layer was exposed. Then, the photoresist layer was removed, the metal layer and the barrier layer that were unetched were formed as the conductive layer were formed on which a patterned layer was formed. The step of etching the metal layer and the barrier layer by the etching process until the conductive layer was exposed was as follows: placing the photoresist layer on which the grooves were formed in an etching solution for etching. The etching solution was composed of 5 g/L of $HNO_3$, 40 g/L of $H_3PO_4$, and 20 g/L of oxalic acid. A temperature for the etching was 30° C. The time for the etching was 85 s.

(2) An insulating layer was disposed on a side of the gate layer away from the underlay. The insulating layer was a silicon nitride layer and had a thickness of 4000 A.

(3) An active layer was disposed on a side of the insulating layer away from the underlay. The active layer was disposed opposite to the gate. The active layer was an amorphous silicon layer and had a thickness of 1500 A.

(4) A data line was disposed on a side of the insulating layer away from the underlay. The data line was separated from the active layer. The step of disposing the data line on the side of the insulating layer away from the underlay was as follows:

(a) A conductive layer was sputtered on the side of the insulating layer away from the underlay. The conductive layer was a titanium layer and had a thickness of 400 A.

(b) A metal layer and a barrier layer were sputtered sequentially on a side of the conductive layer away from the underlay. The metal layer was made of copper and had a thickness of 4000 A. The barrier layer was made of titanium, and had a thickness of 300 A.

(c) A photoresist layer was applied on a side of the barrier layer away from the underlay.

(d) A side of the photoresist layer away from the barrier layer was exposed using a mask and then developed to form grooves passing through the photoresist layer on the photoresist layer, so as to form a patterned photoresist layer. The metal layer and the barrier layer were etched by an etching process until the conductive layer was exposed. Then, the photoresist layer was removed, the metal layer and the barrier layer that were unetched were formed as the conductive layer were formed on which a patterned layer was formed. The step of etching the metal layer and the barrier layer by the etching process until the conductive layer was exposed was as follows: placing the photoresist layer on which the grooves were formed in an etching solution for etching. The etching solution was composed of 5 g/L of $HNO_3$, 40 g/L of $H_3PO_4$, and 20 g/L of oxalic acid. A temperature for the etching was 30° C. The time for the etching was 85 s.

(5) A source-drain electrode was disposed on a surface of the active layer. The step of disposing the source-drain electrode on the surface of the active layer was as follows:

(a) A conductive layer was sputtered on the surface of the active layer. The conductive layer was an aluminum layer and had a thickness of 400 A.

(b) A photoresist layer was applied on a side of the conductive layer away from the underlay. The photoresist layer had a thickness of 2.2 μm.

(c) The photoresist layer was exposed using a mask and then developed to form grooves passing through the photoresist layer on the photoresist layer, so as to form a patterned photoresist layer.

(d) A functional material was electrochemically deposited on the patterned photoresist layer. Then, the photoresist layer was stripped off to obtain a metal layer and a barrier layer that were stacked, so as to obtain the conductive layer on which a patterned layer was formed, thereby obtaining the source-drain electrode.

The step of electrochemically depositing the functional material on the patterned photoresist layer was as follows. The patterned photoresist layer was placed in an electrolyte. Then, the electrolyte was energized under a condition of a first reduction potential such that a first ion was reduced and deposited on the patterned photoresist layer to form a metal material layer. Then, the electrolyte was energized under a condition of a second reduction potential such that a second ion were reduced and deposited on the metal material layer to form a barrier material layer. The electrochemical deposition was performed in the same electrolyte. The electrolyte was composed of 3 mol/L of $Cu^{2+}$, 0.4 mol/L of $MoO_4^{2-}$, 75 g/L of an acid, 0.7 mL/L of a brightener, 75 mg/L of chloride ion, 0.4 mL/L of a leveling agent and 0.8 mL/L of an additive. The acid was $H_2SO_4$. The brightener was sodium allylsulfonate. The soluble chloride salt (i.e., the chloride ion) was sodium chloride. The leveling agent was polyvinyl alcohol. The first reduction potential was 0.3419V. A thickness of the metal layer was 3000 A. The second reduction potential was −0.0036V. A thickness of the barrier layer was 400 A. A temperature for the electrochemical deposition was 25° C.

(6) A protective layer was disposed on a surface of the source-drain electrode to obtain the array substrate. The protective layer was made of silicon nitride, and had a thickness of 2500 A.

Example 2

The manufacturing process of the array substrate of this example was substantially the same as that of Example 1, except that in the step of disposing the source-drain electrode on the surface of the active layer, the electrolyte was composed of 1.5 mol/L of $Cu^{2+}$, 0.25 mol/L of $MoO_4^{2-}$, 30 mg/L of chloride ion, 30 g/L of an acid, 0.3 mL/L of a brightener, 0.1 mL/L of a leveling agent and 0.1 mL/L of an additive. The acid was $H_3PO_4$. The brightener was sodium lauryl sulfate. The soluble chloride salt (i.e., the chloride ion) was potassium chloride. The leveling agent was polystyrene. The additive is a plating cylinder. The first reduction potential was 0.3419V. A thickness of the metal layer was 2000 A. The second reduction potential was −0.0036V. A thickness of the barrier layer was 300 A. A temperature for the electrochemical deposition was 10° C.

Example 3

The manufacturing process of the array substrate of this example was substantially the same as that of Example 1, except that in the step of disposing the source-drain electrode on the surface of the active layer, the electrolyte was composed of 4 mol/L of $Cu^{2+}$, 0.5 mol/L of $Ti^{2+}$, 120 mg/L of chloride ion, 100 g/L of an acid, 1 mL/L of a brightener, 0.8 mL/L of a leveling agent and 1.5 mL/L of an additive. The acid was HCl. The brightener was chloride ion. The soluble chloride salt was magnesium chloride. The leveling agent was polyacrylic acid. The first reduction potential was 0.3419V. A thickness of the metal layer was 4000 A. The second reduction potential was −1.5V. A thickness of the barrier layer was 300 A. A temperature for the electrochemical deposition was 35° C.

Example 4

The manufacturing process of the array substrate of this example was substantially the same as that of Example 1, except that in the step (4) of disposing the data line on the side of the insulating layer away from the underlay and separating the data line from the active layer, the step of disposing the data line on the side of the insulating layer away from the underlay was as follows:

(a) A conductive layer was sputtered on the side of the insulating layer away from the underlay. The conductive layer was a molybdenum layer and had a thickness of 400 A.

(b) A photoresist layer was applied on a side of the conductive layer away from the underlay. The photoresist layer had a thickness of 2.2 μm.

(c) The photoresist layer was exposed using a mask and then developed to form grooves passing through the photoresist layer on the photoresist layer, so as to form a patterned photoresist layer.

(d) A functional material was electrochemically deposited on the patterned photoresist layer. Then, the photoresist layer was stripped off to obtain a metal layer and a barrier layer that were stacked, so as to obtain the conductive layer on which a patterned layer was formed, thereby obtaining the data line. The step of electrochemically depositing the functional material on the patterned photoresist layer was as follows. The patterned photoresist layer was placed in an electrolyte. The electrolyte was energized under a condition of a first reduction potential or a first reduction current such that a first ion was reduced and deposited on the patterned photoresist layer to form a metal material layer. Then, the electrolyte was energized under a condition of a second reduction potential or a second reduction current such that a second ion were reduced and deposited on the metal material layer to form a barrier material layer. The electrochemical deposition was performed in the same electrolyte, so as to electrochemically depositing the metal material and the barrier material continuously. The electrolyte was composed of 3 mol/L of $Cu^{2+}$, 0.4 mol/L of $MoO_4^{2-}$, 75 g/L of an acid, 0.7 mL/L of a brightener, 75 mg/L of chloride ion, 0.4 mL/L of a leveling agent and 0.8 mL/L of an additive. The acid was $H_2SO_4$. The brightener was sodium allylsulfonate. The soluble chloride salt (i.e., the chloride ion) was sodium chloride. The leveling agent was polyvinyl alcohol. The first reduction potential was 0.3419V. A thickness of the metal layer was 3000 A. The second reduction potential was –0.0036V. A thickness of the barrier layer was 400 A. A temperature for the electrochemical deposition was 25° C.

Example 5

The manufacturing process of the array substrate of this example was substantially the same as that of Example 1, except that in the step (1) of forming the gate layer including the gate and the gate line on the underlay, the step of forming the gate layer on the underlay was as follows:

(a) A conductive layer was sputtered on the underlay. The conductive layer was a molybdenum layer and had a thickness of 400 A. The underlay had a thickness of 0.6 mm.

(b) A photoresist layer was applied on a side of the conductive layer away from the underlay. The photoresist layer had a thickness of 2.2 μm.

(c) The photoresist layer was exposed using a mask and then developed to form grooves passing through the photoresist layer on the photoresist layer, so as to form a patterned photoresist layer.

(d) A functional material was electrochemically deposited on the patterned photoresist layer. Then, the photoresist layer was stripped off to obtain a metal layer and a barrier layer that were stacked, so as to obtain the conductive layer on which a patterned layer was formed, thereby obtaining the gate layer. The step of electrochemically depositing the functional material on the patterned photoresist layer was as follows. The patterned photoresist layer was placed in an electrolyte. The electrolyte was energized under a condition of a first reduction potential or a first reduction current such that a first ion was reduced and deposited on the patterned photoresist layer to form a metal material layer. Then, the electrolyte was energized under a condition of a second reduction potential or a second reduction current such that a second ion were reduced and deposited on the metal material layer to form a barrier material layer. The electrochemical deposition was performed in the same electrolyte, so as to electrochemically depositing the metal material and the barrier material continuously. The electrolyte was composed of 3 mol/L of $Cu^{2+}$, 0.4 mol/L of $MoO_4^{2-}$, 75 g/L of an acid, 0.7 mL/L of a brightener, 75 mg/L of chloride ion, 0.4 mL/L of a leveling agent and 0.8 mL/L of an additive. The acid was $H_2SO_4$. The brightener was sodium allylsulfonate. The soluble chloride salt (i.e., the chloride ion) was sodium chloride. The leveling agent was polyvinyl alcohol. The first reduction potential was 0.3419V. A thickness of the metal layer was 3000 A. The second reduction potential was –0.0036V. A thickness of the barrier layer was 400 A. A temperature for the electrochemical deposition was 25° C.

Example 6

The manufacturing process of the array substrate of this example was substantially the same as that of Example 1, except that the step of electrochemically depositing the functional material on the patterned photoresist layer was as follows. The photoresist layer on which the grooves were formed was placed in a first electrolyte. Then, the electrochemical deposition was performed under a condition of a first reduction potential such that a first ion was reduced and deposited on the patterned photoresist layer to form a metal material layer. When the first ion in the first electrolyte is lower than 5 g/L, a second ion is added into the first electrolyte. Then, the electrochemical deposition was continuously performed under a condition of a second reduction potential such that the second ion was reduced and deposited on the metal material layer to form a barrier material layer. The first electrolyte was composed of 3 mol/L of $Cu^{2+}$ (i.e., the first ion), 75 g/L of an acid, 0.7 mL/L of a brightener, 75 mg/L of chloride ion, 0.4 mL/L of a leveling agent and 0.8 mL/L of an additive. The acid was $H_3PO_4$. The brightener was sodium allylsulfonate. The soluble chloride salt (i.e., the chloride ion) was magnesium chloride. The leveling agent was polyvinyl alcohol. The second ion was added into the first electrolyte such that an initial concentration of the second ion was 0.4 mol/L. the second ion was $MoO_4^{2-+}$. A temperature for the electrochemical deposition was 25° C. The first reduction potential was 0.8V. The second reduction potential was −0.2V. A thickness of the metal layer was 4000 A. A thickness of the barrier layer was 300 A.

Example 7

The manufacturing process of the array substrate of this example was substantially the same as that of Example 6, except that in the step of electrochemically depositing the functional material on the patterned photoresist layer, the first electrolyte was composed of 4.0 mol/L of $Cu^{2+}$, 120 mg/L of chloride ion, 100 g/L of an acid, 1 mL/L of a brightener, 0.8 mL/L of a leveling agent and 1.5 mL/L of an additive. The acid was HCl. The brightener was chloride ion. The soluble chloride salt was magnesium chloride. The leveling agent was polyacrylic acid. When the first ion in the first electrolyte is lower than 0.5 g/L, a second ion is added into the first electrolyte. The second ion was added into the first electrolyte such that an initial concentration of the second ion was 0.5 mol/L. The second ion was $Ti^{2+}$. A temperature for the electrochemical deposition was 35° C. The second reduction potential was −1.5V. A thickness of the metal layer was 4000 A. A thickness of the barrier layer was 300 A.

Example 8

The manufacturing process of the array substrate of this example was substantially the same as that of Example 6, except that the step of disposing the data line on the side of the insulating layer away from the underlay was as follows:
(a) A conductive layer was sputtered on the side of the insulating layer away from the underlay. The conductive layer was a molybdenum layer and had a thickness of 400 A.
(b) A photoresist layer was applied on a side of the conductive layer away from the underlay. The photoresist layer had a thickness of 2.2 μm.
(c) The photoresist layer was exposed using a mask and then developed to form grooves passing through the photoresist layer on the photoresist layer, so as to form a patterned photoresist layer.
(d) A functional material was electrochemically deposited on the patterned photoresist layer. Then, the photoresist layer was stripped off to obtain a metal layer and a barrier layer that were stacked, so as to obtain the conductive layer on which a patterned layer was formed, thereby obtaining the data line. The step of electrochemically depositing the functional material on the patterned photoresist layer was as follows. The photoresist layer on which the grooves were formed was placed in a first electrolyte. Then, the electrochemical deposition was performed under a condition of a first reduction potential, such that the first ion was reduced and deposited on the patterned photoresist layer to form a metal material layer. When the first ion in the first electrolyte is lower than 8 g/L, a second ion is added into the first electrolyte. Then, the electrochemical deposition was continuously performed under a condition of a second reduction potential such that the second ion was reduced and deposited on the metal material layer to form a barrier material layer. The first electrolyte was composed of 3 mol/L of $Cu^{2+}$ (i.e., the first ion), 80 g/L of an acid, 0.8 mL/L of a brightener, 100 mg/L of chloride ion, 0.36 mL/L of a leveling agent and 1.2 mL/L of an additive. The acid was HCl. The brightener was sodium allylsulfonate. The soluble chloride salt (i.e., the chloride ion) was potassium chloride. The leveling agent was polyacrylic acid. The second ion was added into the first electrolyte such that an initial concentration of the second ion was 0.4 mol/L. the second ion was $MoO_4^{2-}$. A temperature for the electrochemical deposition was 30° C. The first reduction potential was 0.6V. The second reduction potential was −0.5V. A thickness of the metal layer was 4000 A. A thickness of the barrier layer was 300 A.

Example 9

The manufacturing process of the array substrate of this example was substantially the same as that of Example 6, except that the step of forming the gate layer on the underlay was as follows:
(a) A conductive layer was sputtered on the underlay. The conductive layer was a molybdenum layer and had a thickness of 400 A.
(b) A photoresist layer was applied on a side of the conductive layer away from the underlay. The photoresist layer had a thickness of 2.2 μm.
(c) The photoresist layer was exposed using a mask and then developed to form grooves passing through the photoresist layer on the photoresist layer, so as to form a patterned photoresist layer.
(d) A functional material was electrochemically deposited on the patterned photoresist layer. Then, the photoresist layer was stripped off to obtain a metal layer and a barrier layer that were stacked, so as to obtain the conductive layer on which a patterned layer was formed, thereby obtaining a gate. The step of electrochemically depositing the functional material on the patterned photoresist layer was as follows. The photoresist layer on which the grooves were formed was placed in a first electrolyte. Then, the electrochemical deposition was performed under a condition of a first reduction potential, such that the first ion was reduced and deposited on the patterned photoresist layer to form a metal material layer. When the first ion in the first electrolyte is lower than 2 g/L, a second ion is added into the first electrolyte. Then, the electrochemical deposition was continuously performed under a condition of a second reduction potential such that the second ion was reduced and deposited on the metal material layer to form a barrier material layer. The first electrolyte was composed of 3 mol/L of $Cu^{2+}$ (i.e., the first ion), 50 g/L of an acid, 0.4 mL/L of a brightener, 50 mg/L of chloride ion, 0.3 mL/L of a leveling agent and 0.5 mL/L of an additive. The acid was $H_3PO_4$. The brightener was sodium lauryl sulfate. The soluble chloride salt (i.e., the chloride ion) was magnesium chloride. The leveling agent was polyvinyl alcohol. The second ion was added into the first electrolyte such that an initial concentration of the second ion was 0.35 mol/L. the second ion was $MoO_4^{2-}$. The first reduction potential was 0.34V. The second reduction potential was −0.3V. A thickness of the metal layer was 4000 A. A thickness of the barrier layer was 300 A. A temperature for the electrochemical deposition was 20° C.

Example 10

The manufacturing process of the array substrate of this example was substantially the same as that of Example 1, except that in the step of disposing the source-drain electrode on the surface of the active layer, a metal layer and a barrier layer are sequentially sputtered on the side of the conductive layer away from the underlay. A photoresist layer was applied on a side of the barrier layer away from the underlay. A side of the photoresist layer away from the barrier layer was exposed using a mask and then developed to form grooves passing through the photoresist layer on the photoresist layer, so as to form a patterned photoresist layer. The metal layer and the barrier layer were etched by an etching process until the conductive layer was exposed. Then, the photoresist layer was removed, the metal layer and the barrier layer that were unetched were formed as a patterned layer. Then, source-drain electrode was obtained. The step of etching the metal layer and the barrier layer by the etching process until the conductive layer was exposed was as follows: placing the photoresist layer on which the grooves were formed in an etching solution for etching. The etching solution was composed of 5 g/L of $HNO_3$, 40 g/L of $H_3PO_4$, and 20 g/L of oxalic acid. A temperature for the etching was 30° C. The time for the etching was 80 s.

Example 11

The manufacturing process of the array substrate of this example was substantially the same as that of Example 1, except that in the step of sequentially electrochemically depositing the metal material and the barrier material on the patterned photoresist layer, the photoresist layer on which the grooves were formed was placed in a first electrolytic cell containing an electrolyte. Then, the electrochemical deposition was performed at a first reduction potential to deposit the metal material in the grooves, so as to obtain a metal material layer. Then, the underlay was taken out and placed in a second electrolytic cell containing the same electrolyte. Then, the electrochemical deposition was performed at a second reduction potential to deposit the barrier material in the grooves, so as to obtain a barrier material layer.

Test:

Each of the gate layers, the data lines, and the source-drain electrodes of Examples 1 to 11 was measured for the conductivity. Each of the array substrates of Examples 1 to 11 was measured for the charging time. Each of the array substrates of Examples 1 to 11 was assembled into a liquid crystal display panel, which was measured for the refresh rate. The measurement results are shown in Table 1. Table 1 shows the conductivity of the gate layers, the data lines and the source-drain electrodes of Examples 1 to 11, the charging time of the array substrates of Examples 1 to 11, and the refresh rate of the liquid crystal display panels containing the array substrates of Examples 1-11. The conductivity was measured by a four-probe method. The refresh rate was measured by an oscilloscope.

TABLE 1

| | Conductivity ($10^6$ s/m) | | | Array | Liquid Crystal |
|---|---|---|---|---|---|
| | Gate Layer | Data Line | Source-drain Electrode | Substrate Charging Time (μs) | Display Panel Refresh Rate (Hz) |
| Example 1 | 2.8 | 2.5 | 4.5 | 11.7 | 60 |
| Example 2 | 2.8 | 2.5 | 4.1 | 12.2 | 60 |
| Example 3 | 2.8 | 2.5 | 3.8 | 12.6 | 60 |
| Example 4 | 2.7 | 5.1 | 4.6 | 10.8 | 60 |
| Example 5 | 4.8 | 2.7 | 4.7 | 10.3 | 60 |
| Example 6 | 2.8 | 2.5 | 5.3 | 12.5 | 60 |
| Example 7 | 2.8 | 2.5 | 4.7 | 13.0 | 60 |
| Example 8 | 2.7 | 4.8 | 4.9 | 11.9 | 60 |
| Example 9 | 4.7 | 2.7 | 5.1 | 11.4 | 60 |

TABLE 1-continued

| | Conductivity ($10^6$ s/m) | | | Array | Liquid Crystal |
|---|---|---|---|---|---|
| | Gate Layer | Data Line | Source-drain Electrode | Substrate Charging Time (μs) | Display Panel Refresh Rate (Hz) |
| Example 10 | 2.8 | 2.5 | 3.2 | 14.8 | 60 |
| Example 11 | 2.8 | 2.5 | 2.4 | 14.2 | 60 |

As can be seen from Table 1, the conductivity of the source-drain electrodes obtained in Examples 1 to 9 was between $3.8*10^6$S/m and $5.3*10^6$S/m, higher than that of Example 10. The charging time of the array substrates obtained in Examples 1 to 9 was between 10 μs and 12 μs, lower than that of Example 10, indicating that the source-drain electrodes manufactured by electrochemical deposition in the above embodiments had a higher conductivity, such that the charging time of the array substrate is shortened. In addition, the refresh rate of the liquid crystal display panels containing the array substrates of Examples 1 to 9 was 60 Hz, respectively, indicating that the array substrates obtained by the methods in the above embodiments can be used to manufacture the liquid crystal display panels with a higher refresh rate. The conductivity of the data line of Example 4 is higher than that of Example 1, and the conductivity of the data line of Example 8 is higher than that of Example 9, indicating that the data lines manufactured by electrochemical deposition in the above embodiments had a higher conductivity. The conductivity of the gate layer of Example 5 is higher than that of Example 1, and the conductivity of the gate layer of Example 8 is higher than that of Example 9, indicating that the gate layers manufactured by electrochemical deposition in the above embodiments had a higher conductivity. The charging time for the pixels in the array substrates of Embodiments 5 and 3 is shorter than that of Embodiments 6 to 7, respectively, indicating that the methods for manufacturing the array substrates of Embodiments 6 to 7 are more beneficial to shorten the charging time of the array substrate. In summary, the methods of the above embodiments can manufacture gates, data lines, and source and drain electrodes with a higher conductivity, and can manufacture the array substrates with a shorter charging time.

Technical features of the embodiments as described above can be arbitrarily combined. For simplifying the description, all possible combinations of technical features in the above embodiments are not described. However, as long as there is no contradiction in the combination of these technical features, they should be fallen within the scope of this description.

Only several implementations of the present disclosure are illustrated in the aforementioned embodiments, and the description thereof is relatively specific and detailed, but it should not be understood as a limitation on the scope of the present disclosure. It should be noted that for those of ordinary skill in the art, without departing from the concept of the present disclosure, several modifications and improvements can be made, which all fall within the protection scope of the present disclosure. Therefore, the protection scope of the present disclosure shall be subject to the appended claims.

What is claimed is:

1. A method for manufacturing a source-drain electrode, comprising steps of:
    disposing a conductive layer on an underlay;

forming a photoresist layer on a side of the conductive layer away from the underlay;
exposing and then developing the photoresist layer to form grooves passing through the photoresist layer on the photoresist layer, so as to form a patterned photoresist layer; and
electrochemically depositing a functional material on the patterned photoresist layer and then removing the patterned photoresist layer to obtain the conductive layer on which a patterned layer is formed, so as to obtain the source-drain electrode;
wherein the step of electrochemically depositing the functional material on the patterned photoresist layer and then removing the photoresist layer to obtain the conductive layer on which the patterned layer is formed comprises: sequentially electrochemically depositing a metal material and a barrier material on the patterned photoresist layer and then removing the photoresist layer to form a metal layer and a barrier layer that are stacked, so as to obtain the patterned layer;
wherein the step of sequentially electrochemically depositing the metal material and the barrier material on the patterned photoresist layer comprises:
placing the patterned photoresist layer in an electrolyte containing a first ion and a second ion;
energizing the electrolyte under a condition of a first reduction potential or a first reduction current such that the first ion is reduced and deposited on the patterned photoresist layer to form a metal material layer; and
energizing the electrolyte under a condition of a second reduction potential or a second reduction current such that the second ion is reduced and deposited on the metal material layer to form a barrier material layer; and
wherein the first ion is $Cu^{2+}$, the second ion is $MoO_4^{2-}$ or $Ti^{2+}$; and/or
the electrolyte contains the first ion of 1.5 mol/L to 4.0 mol/L and the second ion of 0.25 mol/L to 0.5 mol/L; and/or
the first reduction potential is 0.3419 V, and a density of the first reduction current is in a range of 1.5 $A/dm^2$ to 8.0 $A/dm^2$.

2. The method for manufacturing a source-drain electrode according to claim 1, wherein the step of sequentially electrochemically depositing the metal material and the barrier material on the patterned photoresist layer comprises:
placing the patterned photoresist layer in a first electrolyte containing a first ion for electrochemical deposition such that the first ion is reduced and deposited on the patterned photoresist layer to form a metal material layer; and
placing the patterned photoresist layer on which the metal material layer is formed in a second electrolyte containing a second ion for electrochemical deposition such that the second ion is reduced and deposited on the metal material layer to form a barrier material layer.

3. The method for manufacturing a source-drain electrode according to claim 2, wherein prior to the step of placing the patterned photoresist layer on which the metal material layer is formed in the second electrolyte for electrochemical deposition, the method further comprises a step of manufacturing the second electrolyte comprising adding the second ion into the first electrolyte to obtain the second electrolyte.

4. The method for manufacturing a source-drain electrode according to claim 2, wherein an initial concentration of the first ion in the first electrolyte is in range of 1.5 mol/L to 4.0 mol/L, and an initial concentration of the second ion in the second electrolyte is in a range of 0.25 mol/L to 0.5 mol/L; and/or
the step of placing the patterned photoresist layer in the first electrolyte for electrochemical deposition comprises: energizing the first electrolyte under a condition of a first reduction potential or a first reduction current such that the first ion is reduced and deposited on the patterned photoresist layer to form the metal material layer, wherein the first ion is $Cu^{2+}$, the first reduction potential is in a range of 0.34V to 0.8V, and a density of the first reduction current is in a range of 1.5 $A/dm^2$ to 8 $A/dm^2$; and/or
the step of placing the patterned photoresist layer on which the metal material layer is formed in the second electrolyte for electrochemical deposition comprises: energizing the second electrolyte under a condition of a second reduction potential or a second reduction current such that the second ion is reduced and deposited on the metal material layer to form the barrier material layer, wherein the second ion is $MoO_4^{2-}$ or $Ti^{2+}$; in the case where the second ion is $MoO_4^{2-}$, the second reduction potential is in a range of −0.3V to 0.1V, and a density of the second reduction current is in a range of 0.5 $A/dm^2$ to 1.2 $A/dm^2$; in the case where the second ion is $Ti^{2+}$, the second reduction potential is in a range of −1.2V to −1.7 V, and a density of the second reduction current is in a range of 5 $A/dm^2$ to 50 $A/dm^2$.

5. The method for manufacturing a source-drain electrode according to claim 1, wherein the underlay is a glass substrate, a plastic substrate, or a flexible substrate.

6. The method for manufacturing a source-drain electrode according to claim 1, wherein a thickness of the underlay is in a range of 0.2 mm to 1 mm.

7. The method for manufacturing a source-drain electrode according to claim 1, wherein the conductive layer is a metal conductive layer.

8. The method for manufacturing a source-drain electrode according to claim 1, wherein the conductive layer is a molybdenum layer or a titanium layer.

9. The method for manufacturing a source-drain electrode according to claim 1, wherein in the step of disposing the conductive layer on the underlay, the conductive layer is disposed on the underlay by deposition.

10. The method for manufacturing a source-drain electrode according to claim 9, wherein a method for the deposition is vapor deposition or electrochemical deposition.

11. The method for manufacturing a source-drain electrode according to claim 9, wherein a thickness of the conductive layer is in a range of 300 A to 800 A.

12. A method for manufacturing an array substrate, comprising steps of:
disposing a gate layer on an underlay;
disposing an insulating layer on a side of the gate layer away from the underlay;
disposing an active layer and a data line on a side of the insulating layer away from the underlay;
disposing a first conductive layer on the active layer;
forming a first photoresist layer on a side of the first conductive layer away from the underlay;
exposing and then developing the first photoresist layer to form grooves passing through the first photoresist layer on the first photoresist layer, so as to form a patterned first photoresist layer; and electrochemically depositing a first functional material on the patterned first photoresist layer and then removing the patterned first photoresist layer to obtain the first conductive layer on which a first patterned layer is formed, so as to form a source-drain electrode, thereby obtaining an array substrate;

wherein the step of disposing the gate layer on the underlay comprises:

disposing a second conductive layer on the underlay; forming a second photoresist layer on a side of the second conductive layer away from the underlay; exposing and then developing the second photoresist layer to form grooves passing through the second photoresist layer on the second photoresist layer, so as to form a patterned second photoresist layer; and electrochemically depositing a second functional material on the patterned second photoresist layer and then removing the second photoresist layer to obtain the second conductive layer on which a second patterned layer is formed, so as to obtain the gate layer;

or wherein the step of disposing the data line on the side of the insulating layer away from the underlay comprises:

disposing a third conductive layer on the side of the insulating layer away from the underlay; forming a third photoresist layer on a side of the third conductive layer away from the underlay; exposing and then developing the third photoresist layer to form grooves passing through the third photoresist layer on the third photoresist layer, so as to form a patterned third photoresist layer; and electrochemically depositing a third functional material on the patterned third photoresist layer and then removing the third photoresist layer to obtain the third conductive layer on which a third patterned layer is formed, so as to obtain the data line.

13. The method for manufacturing an array substrate according to claim 12, wherein prior to the step of disposing the first conductive layer on the active layer, the method further comprises:

disposing an ohmic contact layer on a side of the active layer away from the insulating layer; wherein the ohmic contact layer is located between the active layer and the source-drain electrode.

14. The method for manufacturing an array substrate according to claim 13, wherein the ohmic contact layer covers a surface of the active layer; a part of the drain electrode covers a side of the insulating layer away from the underlay, and the other part thereof covers the ohmic contact layer; a part of the source electrode covers a side of the insulating layer away from the underlay, and the other part thereof covers the ohmic contact layer.

15. The method for manufacturing an array substrate according to claim 14, wherein the ohmic contact layer is disposed on a side of the active layer away from the insulating layer by a deposition process.

* * * * *